United States Patent
Folta

(10) Patent No.: US 7,062,348 B1
(45) Date of Patent: Jun. 13, 2006

(54) DYNAMIC MASK FOR PRODUCING UNIFORM OR GRADED-THICKNESS THIN FILMS

(75) Inventor: James A. Folta, Livermore, CA (US)

(73) Assignee: The Extreme Ultaviolet Lithography LLC, Santa Clara, CA (US)

(*) Notice: Subject to any disclaimer, the term of this patent is extended or adjusted under 35 U.S.C. 154(b) by 961 days.

(21) Appl. No.: 09/615,281

(22) Filed: Jul. 13, 2000

(51) Int. Cl.
*G06F 19/00* (2006.01)

(52) U.S. Cl. .............. 700/118; 204/192.11; 204/298.11

(58) Field of Classification Search ................ 700/118, 700/119, 121; 427/163.2, 128, 255.5, 248.1, 427/255.7, 282, 526; 204/192.11, 192.12, 204/298.11, 298.04, 298.23; 118/690, 715, 118/720, 723, 301, 504; 359/885
See application file for complete search history.

(56) References Cited

U.S. PATENT DOCUMENTS

| 3,636,916 | A | * | 1/1972 | Thelen et al. ................ 118/690 |
| 4,303,489 | A | * | 12/1981 | Morrison, Jr. ......... 204/192.12 |
| 4,315,960 | A | * | 2/1982 | Ohji et al. ................ 427/248.1 |
| 4,536,419 | A | * | 8/1985 | Kubota et al. ........... 427/255.5 |
| 5,144,498 | A | * | 9/1992 | Vincent ...................... 359/885 |
| 5,156,727 | A | * | 10/1992 | Bjornard et al. ........ 204/298.11 |
| 6,093,445 | A | * | 7/2000 | Nawate ...................... 427/128 |
| 6,197,164 | B1 | * | 3/2001 | Pinarbasi ............... 204/192.11 |
| 6,303,182 | B1 | * | 10/2001 | Eggleton et al. ......... 427/163.2 |

FOREIGN PATENT DOCUMENTS

JP 64-37586 * 2/1989

OTHER PUBLICATIONS

M.P. Bruijn et al., Automatic electron-beam deposition of multilayer soft x-ray coatings with laterally graded d-spacing, Optical Engineering, Aug. 1986, vol. 25, No. 8, pp. 916-921.

* cited by examiner

*Primary Examiner*—Leo Picard
*Assistant Examiner*—Steven R. Garland
(74) *Attorney, Agent, or Firm*—John P. Wooldridge

(57) ABSTRACT

A method for producing single layer or multilayer films with high thickness uniformity or thickness gradients. The method utilizes a moving mask which blocks some of the flux from a sputter target or evaporation source before it deposits on a substrate. The velocity and position of the mask is computer controlled to precisely tailor the film thickness distribution. The method is applicable to any type of vapor deposition system, but is particularly useful for ion beam sputter deposition and evaporation deposition; and enables a high degree of uniformity for ion beam deposition, even for near-normal incidence of deposition species, which may be critical for producing low-defect multilayer coatings, such as required for masks for extreme ultraviolet lithography (EUVL). The mask can have a variety of shapes, from a simple solid paddle shape to a larger mask with a shaped hole through which the flux passes. The motion of the mask can be linear or rotational, and the mask can be moved to make single or multiple passes in front of the substrate per layer, and can pass completely or partially across the substrate.

8 Claims, 3 Drawing Sheets

DYNAMIC MASK FOR PRODUCING UNIFORM OR GRADED-THICKNESS THIN FILMS

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to the deposition of thin films on a substrate, particularly to a method for producing thin or multilayer films with uniform or graded thickness, and more particularly to the use of dynamic masking for producing ion beam sputtered or evaporated thin or multilayer films with high thickness uniformity or thickness gradients.

In recent years substantial effort has been directed to the development of thin films, particularly multilayer films or coatings. Thin films or coatings are produced by various vapor-deposition techniques in which a substrate to be coated is exposed to a vapor of the coating material and accumulates a thin film thereon through condensation of the vapor. In the case of optical films for extreme ultraviolet (EUV) lithography, it is desirable that the coating be very uniform (~0.1%) in thickness across the substrate. Also, there are optical applications which require film or coating thickness gradients.

Multilayer coatings for EUV lithography masks and other optical coatings are commonly deposited with ion beam sputtering, as shown in FIG. 1. The typical system contains a focused ion source directed at a sputter target. The ions sputtered from the material of the target are directed onto a substrate. For deposition of multilayers, the ion beam is interrupted by either turning off the ion flux or shuttering the ion beam, during which time a sputter target with a different composition is interchanged with the original target.

Another common vapor deposition technique is evaporation, in which the source material is heated so that vapor is emitted which condenses on the substrate. The source can be heated with an electron beam, resistively, or by other means. The flux from the evaporation source is similar to that from the ion beam sputter target.

Modification of film properties deposited with ion beam sputtering and evaporation can be achieved by directing a separate ion source at the substrate, as shown in FIG. 2A for ion beam sputtering and in FIG. 2B for e-beam evaporation. The ion assist may remove some of the deposited species, so it must also be controlled to achieve precise thickness control.

In these prior techniques, the locations, separation distances, and tilt angles of the components are adjusted to trade off performance variables such as deposition rate and thickness distribution (uniformity or gradient) and defect levels. However, the effects of the system configuration on the performance variables and their trade-offs are complex and not well understood. The situation is even more complex for curved optical substrates.

The film thickness distribution is most strongly affected by the source-to-substrate distance and tilt angle of the substrate. The substrate(s) are commonly spun either about their own axis of symmetry or another axis to improve azimuthal uniformity, but radial non-uniformities remain. Carefully shaped deposition masks, or shapers, can be inserted between the source and the substrate to compensate for non-uniformity. The masking operation requires tedious iteration of the shape of the mask, and can be impractical for cases where very high uniformity is required. Since the source flux distribution can change over time as the source or target is consumed, the mask shape may require modification. This would require another mask fabrication and perhaps venting the chamber to atmosphere (undesirable) to install the new mask.

In addition to the need for uniform thickness of thin single layer or multilayer films, there is also a need for thin single layer and multilayer films of graded thickness. One prior approach to obtaining graded thickness involves computer-controlled movement of shutters. See M. P. Bruijn, et al., Automatic electron-beam deposition of multilayer soft x-ray coatings with laterally graded d-spacing, Optical Engineering, August 1986, Vol. 25, No. 8. In this approach, two shutters are moved in mutually perpendicular directions in front of a substrate over an area 10 cm×10 cm, with each shutter having a linear motion, such that movement of the two perpendicular slits result in a square aperture through which flux from a source is directed onto the substrate. A recently successfully demonstrated technique which greatly improves uniformity for magnetron sputter deposition systems is described and claimed in copending U.S. Pat. No. 6,524,449, filed Dec. 3, 1999, issued Feb. 25, 2003, entitled "Method and System For Producing Sputtered Thin Films With Sub-Angstrom Thickness Uniformity or Custom Thickness Gradients," assigned to the same assignee, and is directed to systems in which the substrate is translated across stationary sources. That technique involves measuring the non-uniform flux distribution from the sputter sources—the flux distribution is then used as input data to a computer model that relates a given velocity profile of the substrate platter to the resulting thickness distribution of the deposited films. With a set of these relationships calculated in advance, the user can select a substrate platter velocity profile recipe to obtain the desired film thickness distribution. The method of the above-referenced application has been successfully used to improve thin film uniformity to 0.1% over 6-inch substrates and on curved optics (a 5× factor of improvement). Furthermore, that method allows one to develop the process more rapidly than the purely empirical approach, with about half the number of process development runs (iterations). This is especially valuable when coating sets of optics—the many different sizes, shapes, and prescriptions require development of a customized process for every different optic.

The present invention provides a modification to vapor deposition systems, which enables deposition of highly uniform or graded-thickness thin or multilayer films. The invention involves a method which utilizes a moving shaper, or dynamic mask, which blocks some of the flux from the sputter target or evaporation source before it deposits on the substrate. The acceleration, velocity and position of the mask are computer controlled to precisely tailor the film thickness distribution.

SUMMARY OF THE INVENTION

It is an object of the present invention to provide a method for producing thin and multilayer films with uniform or graded thickness.

A further object of the invention is to provide a method for producing single layer or multilayer films with uniform thickness or with thickness gradients using dynamic masking.

Another object of the invention is to provide a method for producing ion beam sputtered or evaporated single or multilayer film with high thickness uniformity or custom thickness gradients using dynamic masking.

Another object of the invention is to utilize computer controlled dynamic masking for producing films having a thickness uniformity with ~0.1% thickness variation across the substrate.

Another object of the invention is to provide a method for producing thin single layer or multilayer films with thickness uniformity or thickness gradients using a computer controlled movable mask which blocks some of the flux from a sputter target or evaporation source before it deposits on the substrate.

Other objects and advantages of the present invention will become apparent from the following description and accompanying drawings. The present invention is directed to a method which provides a modification to vapor deposition systems which enables deposition of highly uniform or graded-thickness thin single layer or multilayer films. The method utilizes a moving shaper or dynamic mask which blocks some of the flux from a sputter target or evaporation source before it deposits on the substrate. The velocity and position of the mask is computer controlled to precisely tailor the film thickness distribution. The moving or dynamic mask can have a variety of shapes, from a simple solid paddle shape to a larger mask with a shaped hole through which the flux passes. The invention is applicable to any type of vapor deposition system, but is most useful for ion beam sputter deposition and electron beam evaporation deposition. It enables a high degree of uniformity for ion beam deposition, even for near-normal incidence of deposition species, which may be critical for producing low-defect multilayer coatings for masks for extreme ultraviolet (EUV) lithography. This method is an extension of the technique for improving uniformity for magnetron sputter systems described and claimed in above-referenced copending application Ser. No. 09/454,673, wherein the substrate is translated across stationary flux sources. The present invention applies to deposition systems in which the substrate is not translated (although it may still be spun or tilted to improve the thickness profile); instead a moving mask is translated between the source and the substrate to achieve the desired thickness profile. Also, the dynamic mask of the present invention is more effective and significantly simpler in operation than the two shutter arrangement which are moved in mutually perpendicular directions in front of the substrate, as disclosed in the above-referenced M. P. Burlyn, et al., system. The method of the present invention enables thin film uniformity to 0.1% over a 6-inch substrate, for example.

BRIEF DESCRIPTION OF THE DRAWINGS

The accompanying drawings, which are incorporated into and form a part of the disclosure, illustrate the prior art and embodiments of the invention and, together with the description, serve to explain the principles of the invention.

DETAILED DESCRIPTION OF THE INVENTION

Figure 1:
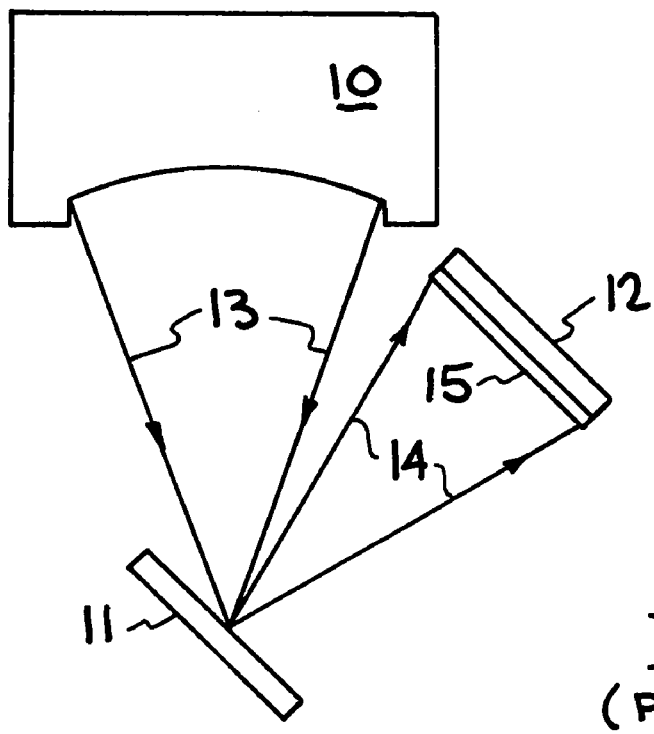
FIG. 1 illustrates a typical deposition system using ion beam sputtering and which contains a focused ion source directed at a sputter target.
Figure 2A:
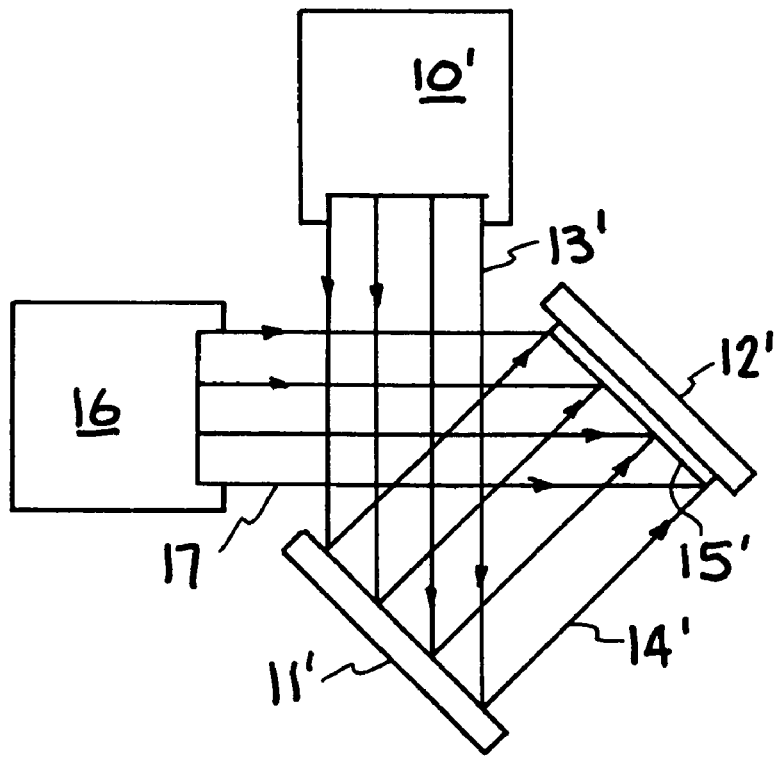
FIGS. 2A and 2B illustrate prior art systems using a separate ion source directed at the substrate for modification of film properties deposited with ion beam sputtering (FIG. 2A) and e-beam evaporation (FIG. 2B).
Figure 2:
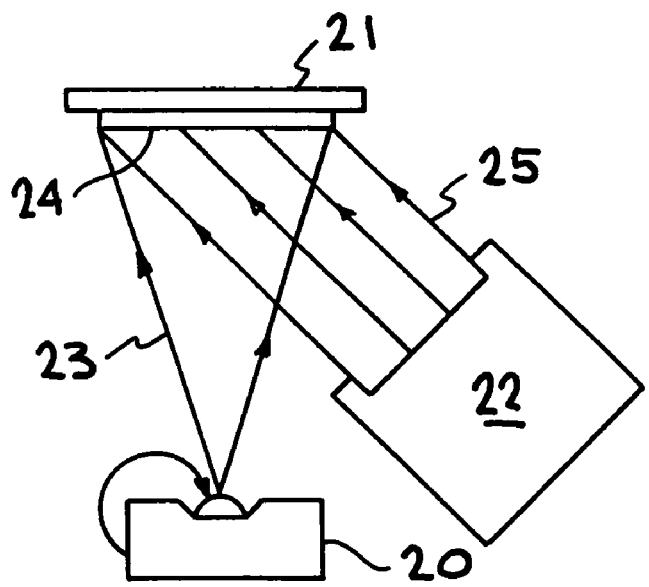

The present invention involves a method for producing ion beam sputtered or evaporated thin single layer or multilayer films with high thickness uniformity or custom thickness gradients using dynamic masking. This invention provides a modification to vapor deposition systems, such as illustrated in FIG. 1 and FIGS. 2A–2B, which will enable deposition of highly uniform thickness or graded thickness thin films, such as low-defect multilayer films or coatings for masks for extreme ultraviolet lithography (EUVL). The film production method of the invention utilizes a moving shaper, or dynamic mask, which blocks some of the flux from the sputter target or evaporation source before it deposits on the surface of a substrate. The acceleration, velocity, and position of the dynamic mask are computer controlled to precisely tailor the film thickness distribution.

Typical prior art ion beam deposition systems using a sputter target are shown in FIGS. 1 and 2A, with FIG. 2B illustrating a typical electron-beam (e-beam) evaporation deposition system, with FIGS. 2A and 2B incorporating an additional ion beam source directed at the substrate for modification of the film properties deposited on the substrate, as discussed above. The deposition system of FIG. 1 comprises a focused ion source 10, a sputter target 11 of selected composition, and a substrate 12. An ion beam indicated by arrows 13 from source 10 is directed onto target 11 which produces flux indicated at 14 which is deposited onto substrate 12 to produce a thin film 15. Typically, the ion beam 13 is focused to a 10 cm$^2$ area on target 11.

FIG. 2A illustrates a prior art ion-assisted ion beam sputter system, which is similar to the deposition system of FIG. 1 except a separate ion source directed at the substrate is added. Components similar to those of FIG. 1 are given corresponding reference numerals. As shown, the system comprises ion source 1 indicated at 10', a target 11' and a substrate 12', with an ion beam 13 being directed onto target 11' for producing flux 14' directed onto substrate 12' for forming therein a thin film 15'. An ion source 2, indicated at 16 produces an ion beam 17 directed onto substrate 12' which causes modification of the properties of the thin film 15' formed on substrate 12', as discussed above.

FIG. 2B illustrates an ion-assisted electron beam (e-beam) evaporation system. As shown, the system comprises an e-beam evaporation source 20, a substrate 21, and an ion beam source 22. Flux, indicated at 23 from evaporation source 20 is directed onto substrate 21 to form a thin film 24 thereon, and an ion beam 25 from ion source 22 is directed toward substrate 21 to modify the properties of the thin film 24.

Figure 3:
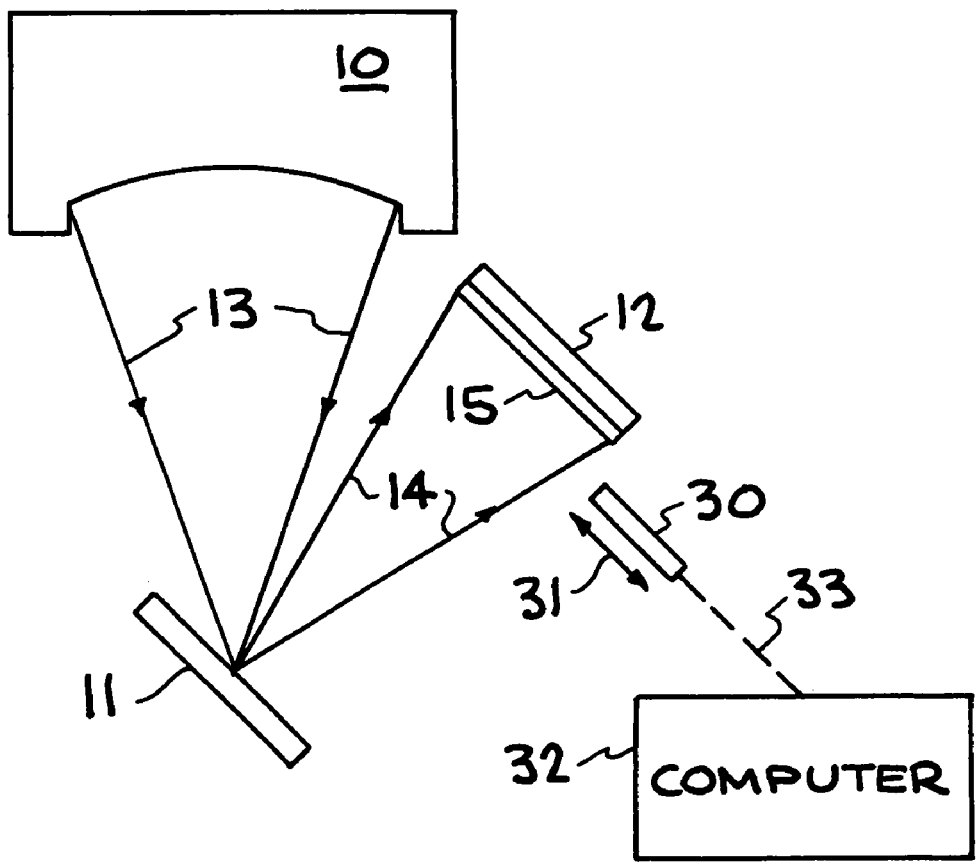
FIG. 3 illustrates the deposition system of FIG. 1 (but incorporating) the moving or dynamic masking method of the present invention.

FIG. 3 illustrates a computer controlled dynamic mask incorporated into an ion beam sputter deposition system, such as illustrated in FIG. 1. Components of FIG. 3 which correspond to those of FIG. 1 are given like reference numerals. The modification of the FIG. 1 system, as shown in FIG. 3, comprises a movable or dynamic mask 30 located adjacent the substrate 12 and motion thereof indicated by arrow 31 is controlled by a computer 32, as indicated by dash line 33. The mask 30 can have a variety of shapes, from a simple solid paddle shape to a larger mask with a shaped hole through which the flux 14, as shown in FIG. 3, passes. The shaped hole of mask 30 can be a simple circle or rectangle, or a more complex shape optimized for uniformity and deposition rate. The motion 31 of mask 30, while shown as linear, can be controlled by computer 32 to make single or multiple passes in front of substrate 12 per layer of deposited material. The mask 30 can be controlled to pass completely or partially across the substrate 12, or it can be rotational or oscillational.

Figure 4A:
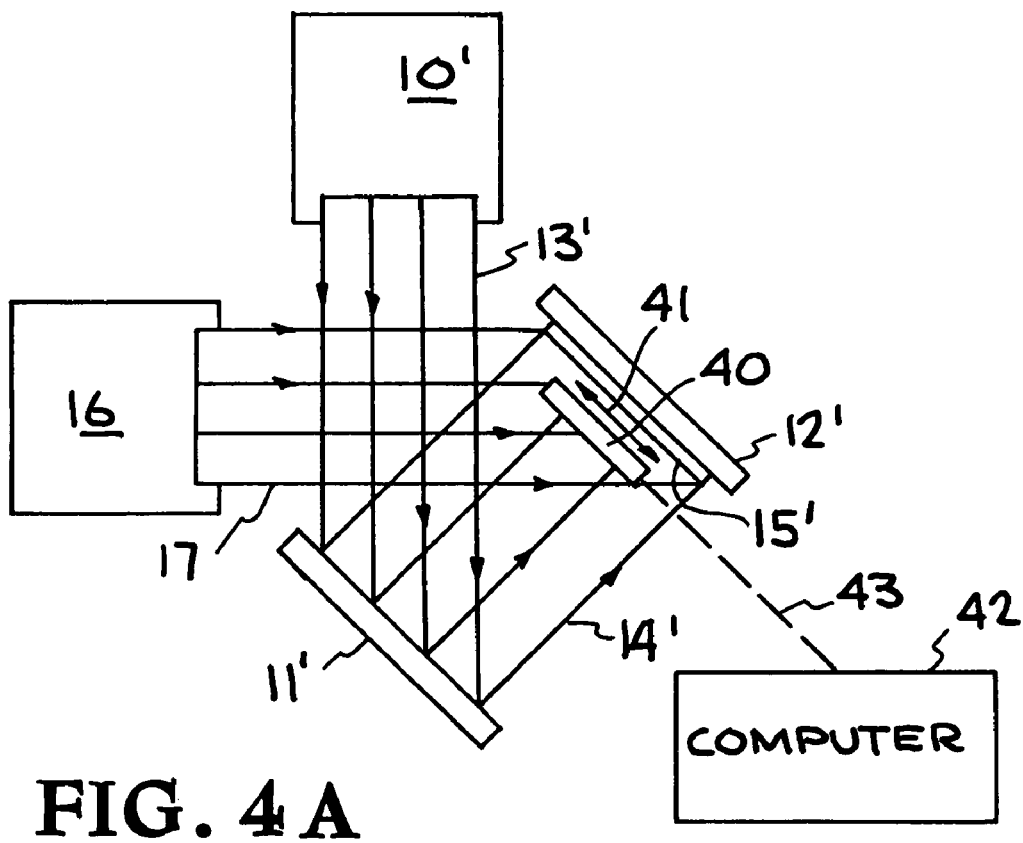
FIGS. 4A and 4B illustrate the deposition systems of FIGS. 2A and 2B but with the incorporation of the moving or dynamic mask arrangements in accordance with the present invention.
Figure 4B:
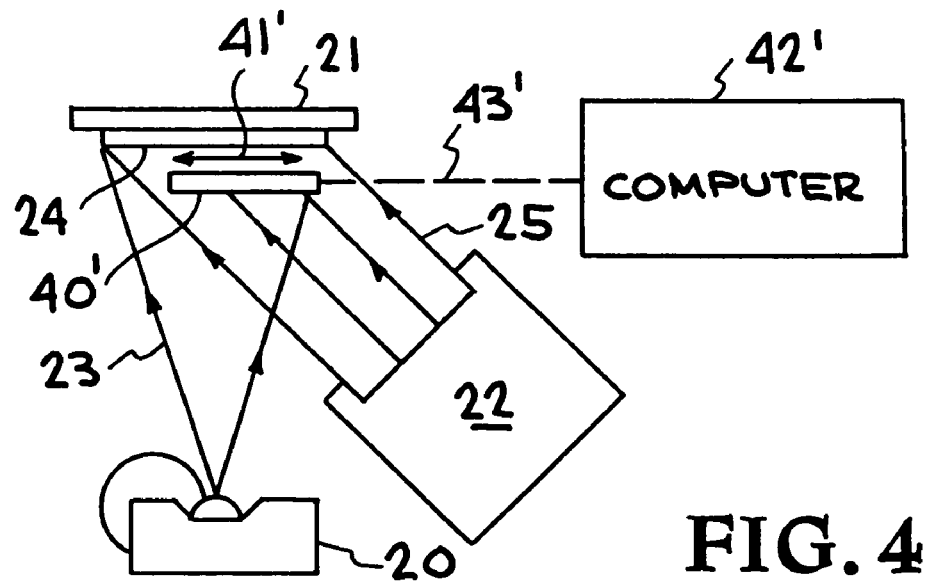

FIGS. 4A and 4B illustrate the dynamic mask of the present invention incorporated into an ion-assisted ion beam sputter system (FIG. 4A) similar to FIG. 2A, and an ion-assisted e-beam evaporation system (FIG. 4B) similar to FIG. 2B. Components of FIGS. 4A and 4B which correspond to those of FIGS. 2A and 2B are given like reference numerals. FIG. 4A adds to the system of FIG. 2A, a movable or dynamic mask 40 located adjacent the substrate 12' with motion thereof indicated by arrow 41 and which is controlled by a computer 42, as indicated by the dash line 43. As indicated by arrow 41, the mask can be moved across the substrate 12', as desired by computer 42. The construction of mask 40 and the motion direction thereof may be described with respect to mask 30 of FIG. 3.

FIG. 4B adds to the system of FIG. 2B, a dynamic mask 40' movable adjacent substrate 21 as indicated by arrow 41' by computer 42' via appropriate connection indicated at dashed line 43'. The dynamic mask 40' may be moved linearly or rotationally, and may be constructed as described above relative to mask 30 of FIG. 3.

Once installed, the hardware and software (components 30–33 of FIG. 3, for example) will allow modification of the film thickness distribution (uniformity or gradient) without fabrication or installation of any additional hardware, such as source flux shapers or masks in front of the substrate. This invention is applicable to any type of vapor deposition system, but is particularly useful for ion beam sputter deposition systems and evaporation deposition systems. It will allow a very high degree of uniformity for ion beam deposition, even for near-normal incidence of deposition species, which may be critical for producing low-defect multilayer coatings for masks for extreme ultraviolet lithography.

As pointed out above, the present invention is an extension of the technique described and claimed in above-referenced application Ser. No. 09/454,673, which successfully demonstrated greatly improved uniformity for magnetron sputter deposition systems. However, that technique was specific to systems in which the substrate is translated across stationary sources. The present invention applies to systems in which the substrate is not translated (although it may be spun or tilted to improve the thickness profile). In the system of the invention, a moving mask is translated ("mask modulation") between the source and the substrate to achieve the desired thickness profile.

The method of the present invention is similar to that used successfully in the above-referenced magnetron sputter system, and involves the following:

1. Measure the source flux distribution experimentally for a given system configuration. One accurate method ("lift-off" with stylus profilometry) is described in the above-referenced application. Theoretical models predicting the distribution may be used but may lack the required accuracy.

2. Develop an algorithm which numerically calculates the film thickness distribution as a function of source flux distribution, substrate shape, mask shape, and mask velocity modulation recipe. From this one can calculate the time that any point on the substrate is exposed to source flux, and integrate the flux received at that point to obtain the final thickness. The calculation is repeated for different points on the substrate surface as needed, giving the final thickness distribution. The model may or may not include the effect of the angular velocity of a spinning substrate or changing the system configuration, such as substrate tilt angle (simulating the effects of which are not novel).

3. Experimentally confirm the model and use it as a tool to rapidly develop processes with precise thickness distribution control. The primary process control variable is the mask velocity modulation recipe, which is easily changed with computer control.

The advantages of the method of the invention include:
 1. Allows easy compensation for changes in thickness profiles caused such as by target wear and source consumption—the mask recipe is easily modified compared to changing the mask design.
 2. A single mask design allows thickness control for optics with different shapes, once again by optimizing the mask velocity recipe.
 3. Thickness uniformity is commonly achieved by tilting the substrate to about 45° with respect to the target or source. This can reduce the deposition rate considerably or increase the rate of defect formation, while this method allows deposition of uniform films at normal incidence and can therefore improve deposition rate and defect levels.
 4. The model also gives a way to predict the sensitivity of the coating process to inaccuracies in substrate or mask position, velocity, etc., which would be tedious to find experimentally and so provides critical guidance on how to improve the deposition system as well as achieve optimized operation.
 5. The method can also be used to compensate for the thickness profile effects during use of ion-beam-assisted deposition. In this case the mask blocks the flux of assisting ions as well as the depositing species. It applies whether the ion assist is applied during deposition as well as intermittently applied during or after deposition of individual layers.

The method of this invention is not limited to uniform coatings. It can also be used to develop coatings in which the thickness is graded across the substrate. Optical coatings commonly have such prescriptions in order to compensate for variations in the incident angle of light across the optic.

It has thus been shown that the present invention provides a method and apparatus for producing thin single layer or multilayer films or coatings with high thickness uniformity or with custom thickness gradients. The invention may be utilized with any type of vapor deposition system, but is particularly applicable for use in ion beam sputter deposition or electron-beam evaporation deposition, with or without ion beam assist. The invention provides a high degree of uniformity for ion beam deposition, even for near-normal incidence of deposition species, which may be critical for producing low-defect multilayer coatings, such as required for masks for EUV lithography. The invention may be utilized, for example, in addition to producing precision uniform or graded multilayer coating for EUV lithography, for EUV optics, lithography masks, production of specially graded coatings on curved optical elements, and precision figure modification of optical elements, as well as uniform films for semiconductor or magnetic recording devices.

While particular embodiments of the invention have been described and/or illustrated to exemplify and explain the principles of the invention, such are not intended to be limiting. Modifications and changes may become apparent to those skilled in the art, and it is intended that the invention be limited only by the scope of the appended claims.

The invention claimed is:

1. In a method for the vapor deposition of thin single layer or multilayer films on a substrate, the improvement comprising:
   positioning a computer controlled dynamic mask adjacent said substrate to block a portion of deposition material directed toward said substrate,
   moving said mask relative to said substrate, and
   controlling acceleration, velocity, and position of said dynamic mask by said computer to precisely tailor film thickness distribution.

2. The improvement of claim 1, wherein moving said mask is carried out to enable one or more of linear or rotational movement of said mask.

3. The improvement of claim 1, wherein said dynamic mask is selected from the group consisting of a solid mask, and a mask with a shaped hole therein.

4. The improvement of claim 3, wherein said shaped hole in said dynamic mask is selected from the group consisting of circular, rectangular, and complex shapes optimized for uniformity and deposition rate.

5. The improvement of claim 1, wherein moving said mask is carried out to enable movement of said mask relative to said substrate selected from at least one of linear movement, rotational movement, single pass, multiple pass, partial pass, and complete pass.

6. The improvement of claim 1, additionally including providing said computer with software capable of moving said dynamic mask so as to form a film on said substrate, wherein said film is selected from the group consisting of uniform thickness films and graded thickness films.

7. The method of claim 1 wherein the vapor deposition of thin films on a substrate is carried out by using a deposition source selected from the group consisting of ion beam sputter source, electron-beam evaporation sources, ion-assisted ion beam sputter sources, and ion-assisted electron-beam evaporation sources, and wherein said dynamic mask is moved so to produce a precisely tailored film with either uniform thickness or graded thickness.

8. The method of claim 7, wherein the film is produced to have a uniform thickness to about 0.1% across the substrate.

* * * * *